(12) United States Patent
 Min

(10) Patent No.: US 11,437,724 B2
(45) Date of Patent: Sep. 6, 2022

(54) ANTENNA MODULE

(71) Applicant: SAMSUNG ELECTRO-MECHANICS CO., LTD., Suwon-si (KR)

(72) Inventor: Tae Hong Min, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 89 days.

(21) Appl. No.: 16/925,847

(22) Filed: Jul. 10, 2020

(65) Prior Publication Data

US 2021/0305699 A1  Sep. 30, 2021

(30) Foreign Application Priority Data

Mar. 25, 2020  (KR) .................. 10-2020-0036013

(51) Int. Cl.
*H01Q 1/22* (2006.01)
*H01Q 9/04* (2006.01)
*H01L 25/18* (2006.01)
*H01L 23/498* (2006.01)
*H01Q 1/52* (2006.01)
*H01L 23/66* (2006.01)
*H01L 23/552* (2006.01)

(52) U.S. Cl.
CPC ..... *H01Q 9/0407* (2013.01); *H01L 23/49822* (2013.01); *H01L 23/66* (2013.01); *H01L 25/18* (2013.01); *H01Q 1/528* (2013.01); *H01L 23/552* (2013.01); *H01L 2223/6677* (2013.01)

(58) Field of Classification Search
CPC .......... H01Q 1/2283; H01L 2223/6677; H01L 23/66
See application file for complete search history.

(56) References Cited

U.S. PATENT DOCUMENTS

| | | | |
|---|---|---|---|
| 2010/0006330 A1 | 1/2010 | Fu et al. | |
| 2014/0145883 A1* | 5/2014 | Baks | H01Q 1/2283 343/700 MS |
| 2016/0095198 A1* | 3/2016 | Min | H05K 3/4608 361/705 |
| 2018/0337148 A1* | 11/2018 | Baek | H01L 23/66 |
| 2019/0027804 A1* | 1/2019 | Kim | H01L 24/20 |
| 2019/0221917 A1* | 7/2019 | Kim | H01Q 9/0407 |
| 2019/0280374 A1* | 9/2019 | Kim | H01L 23/66 |
| 2020/0020653 A1* | 1/2020 | Lim | H01Q 1/243 |
| 2020/0028239 A1* | 1/2020 | So | H01Q 1/2283 |
| 2020/0066662 A1* | 2/2020 | Lee | H01L 23/5385 |

FOREIGN PATENT DOCUMENTS

KR   10-2019-0104978 A   9/2019

* cited by examiner

*Primary Examiner* — Hasan Islam
(74) *Attorney, Agent, or Firm* — Morgan, Lewis & Bockius LLP

(57) ABSTRACT

An antenna module includes: a wiring structure including a plurality of insulating layers and a plurality of wiring layers; a metal structure disposed on one surface of the wiring structure, and having a through-portion; and an antenna disposed on the one surface of the wiring structure. At least a portion of the antenna is disposed in the through-portion.

19 Claims, 7 Drawing Sheets

I-I'

ANTENNA MODULE

CROSS-REFERENCE TO RELATED APPLICATION(S)

This application claims benefit of priority to Korean Patent Application No. 10-2020-0036013 filed on Mar. 25, 2020 in the Korean Intellectual Property Office, the disclosure of which is incorporated herein by reference in its entirety.

TECHNICAL FIELD

The present disclosure relates to an antenna module.

BACKGROUND

With the advent of 5G, a frequency band has increased, and an issue of generating heat in an antenna module for transmitting/receiving this frequency has emerged as a recent problem. In the case of an antenna substrate used in the antenna module, there may be a problem in that it may be difficult to effectively remove heat generated by a radio frequency integrated circuit (RFRC) because it is generally made of an organic material. In addition, since a connection between a main board and an antenna substrate is implemented with a connector, there may be difficulty in transferring and removing heat through a ground of a cable to the main board.

SUMMARY

An aspect of the present disclosure is to provide an antenna module having an excellent heat dissipation effect.

An aspect of the present disclosure is to provide an antenna module capable of effectively reducing other signal interference.

One of the various solutions proposed through the present disclosure is to embed a plurality of passive components that can be grouped in a substrate structure.

One of the various solutions proposed through the present disclosure is to provide a substrate structure by disposing a printed circuit board on a printed circuit board.

According to an aspect of the present disclosure, an antenna module includes: a wiring structure including a plurality of insulating layers and a plurality of wiring layers; a metal structure disposed on one surface of the wiring structure, and having a through-portion; and an antenna disposed on the one surface of the wiring structure. At least a portion of the antenna is disposed in the through-portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Figure 1:
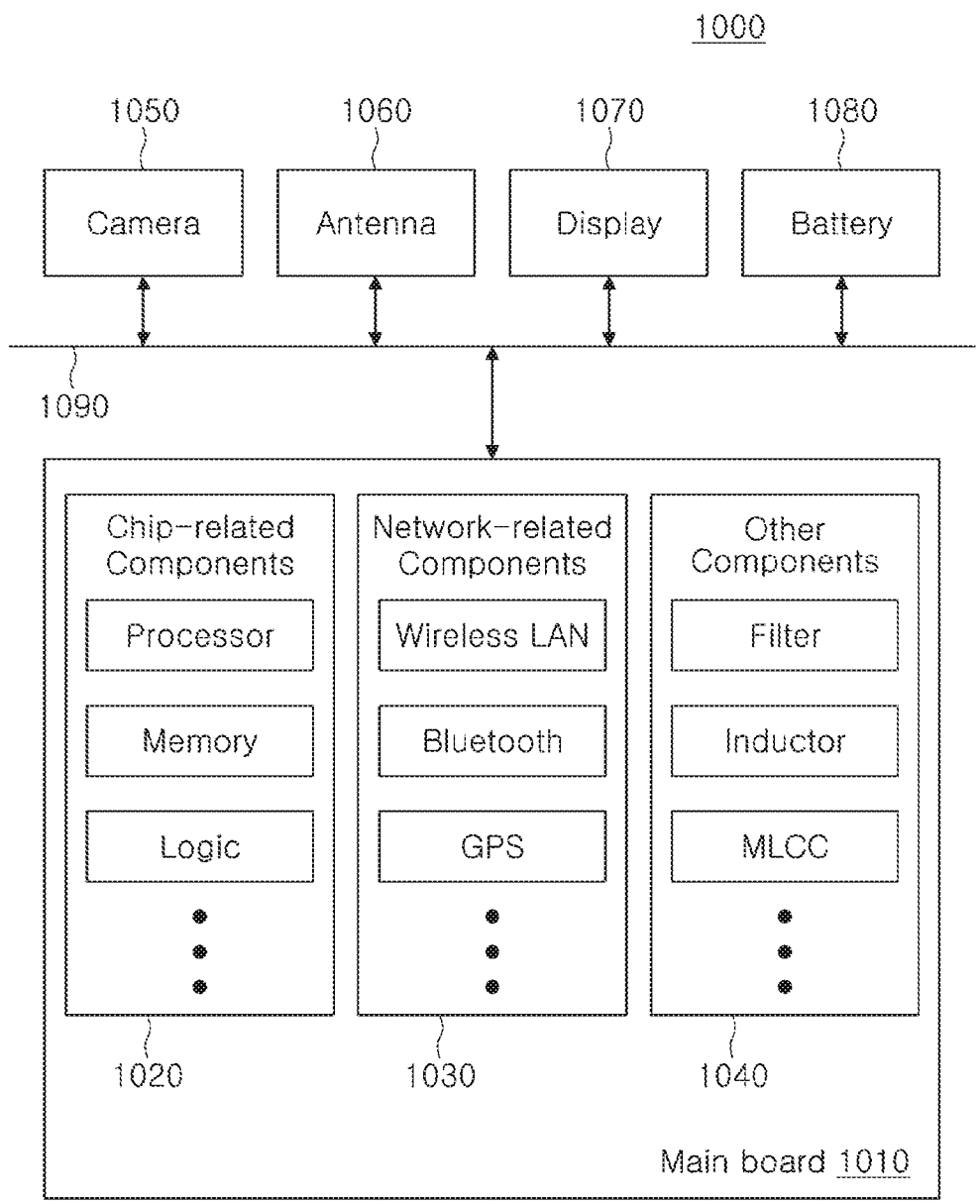
FIG. 1 is a schematic block diagram illustrating an example of an electronic device system.

FIG. 1 is a schematic block diagram illustrating an example of an electronic device system.

Referring to FIG. 1, an electronic device 1000 may receive a motherboard 1010. The motherboard 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
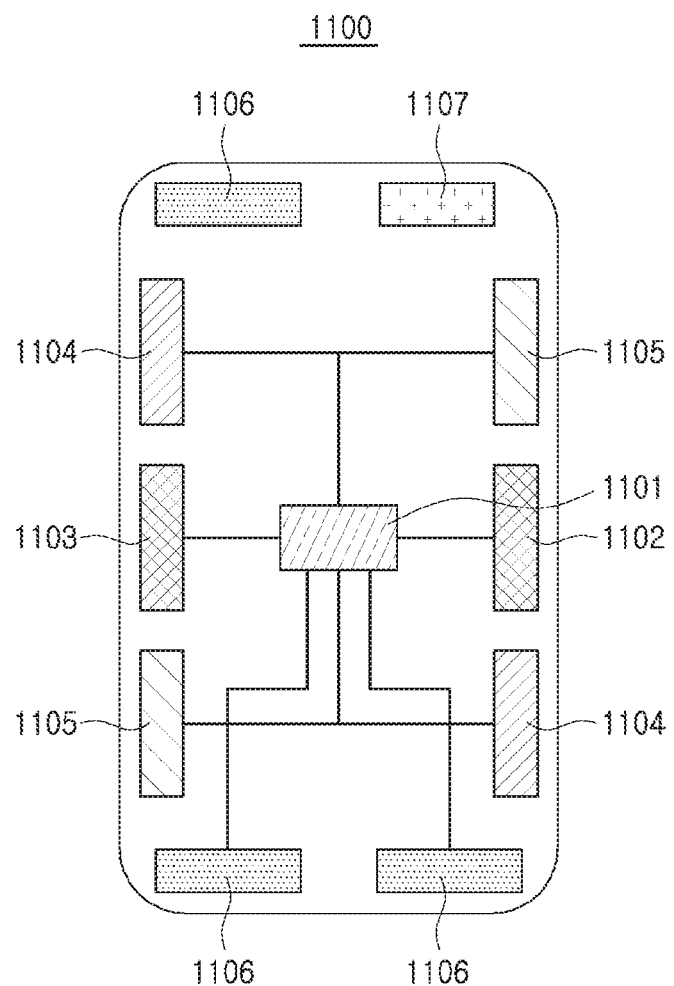
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. Various types of antenna modules 1102, 1103, 1104, 1105, and 1106 connected to a modem 1101 may be disposed through the modem 1101, a rigid printed circuit board, a flexible printed circuit board, and/or a rigid flexible printed circuit board inside the smartphone 1100. If necessary, a Wi-Fi module 1107 may also be disposed. The antenna modules 1102, 1103, 1104, 1105, and 1106 may include antenna modules 1102, 1103, 1104, and 1105 of various frequency bands for 5G mobile communication, for example, an antenna module 1102 for a 3.5 GHz band frequency, an antenna module 1103 for a 5 GHz band frequency, an antenna module 1104 for a 28 GHz band frequency, an antenna module 1105 for a 39 GHz band frequency, and the like, and other 4G antenna module 1106. However, it is not limited thereto. Meanwhile, the electronic device is not necessarily limited to the smartphone 1100, and may be other electronic devices as described above.

Figure 3:
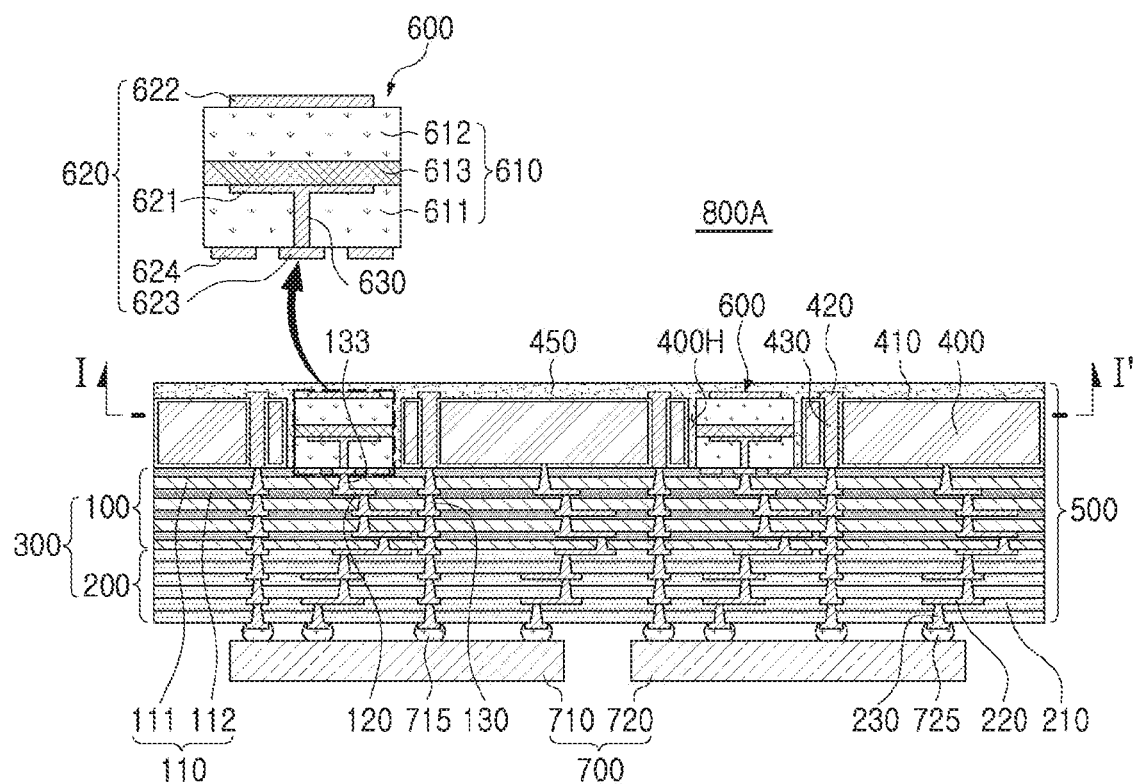
FIG. 3 is a schematic cross-sectional view illustrating an example of an antenna module.

FIG. 3 is a schematic cross-sectional view illustrating an example of an antenna module.

Figure 4:
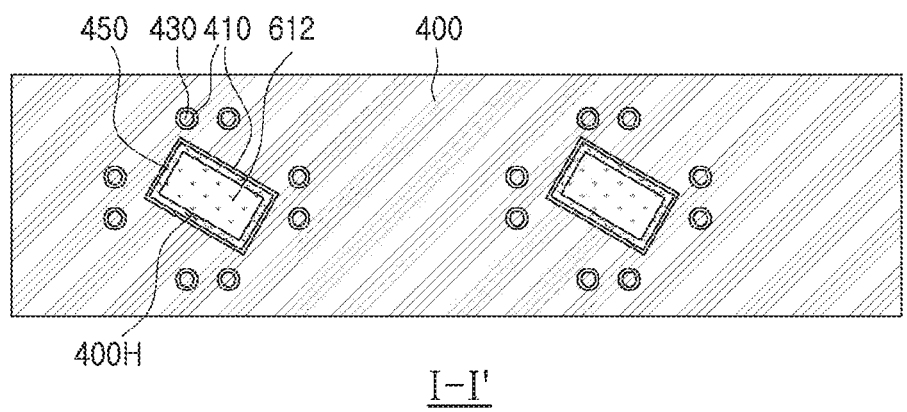
FIG. 4 is a schematic I-I' cut plan view illustrating an example of the antenna module of FIG. 3.

FIG. 4 is a schematic I-I' cut plan view of the antenna module of FIG. 3.

Referring to FIGS. 3 and 4, an antenna module 800A includes an antenna substrate 500 and one or more antennas 600 embedded in the antenna substrate 500. The antenna substrate 500 includes a wiring structure 300 and a metal structure 400 disposed on one surface of the wiring structure 300. The metal structure 400 includes one or more through portions 400H. The antenna 600 is disposed on an upper surface of the wiring structure 300, and at least a portion thereof is located in the through-portion 400H. An electronic component 700 may be mounted on the antenna substrate 500. For example, one or more electronic components 700 may be disposed on a lower surface of the wiring structure 300.

As described above, in an antenna module 800A according to an example, the metal structure 400 is disposed on the wiring structure 300, and the antennas 600 are respectively disposed in the through-portion 400H of the metal structure 400. Therefore, even when the electronic component 700 having high heat generation such as an RFIC 710 or the like, is disposed on the wiring structure 400, it is possible to provide an excellent heat dissipation path connected to the metal structure 400. Therefore, it is possible to have an excellent heat dissipation effect, as heat generated by a power amplifier (PA) due to signal amplification can be dissipated through the metal structure 400. In addition, since the antennas 600 are independently surrounded by the metal structures 400, respectively, it is possible to effectively improve signal interference in relation to antenna signals.

Meanwhile, at least a portion of each of the upper and lower surfaces of the metal structure 400 and at least a portion of the wall surfaces of each of the through-portions 110H may be covered with an insulator 410. In this case, adhesion between the wiring structure 300 and the metal structure 400 may be improved, and adhesion between the metal structure 400 and the passivation layer 450 to be described later may also be improved. Meanwhile, a through-via 430 penetrating the metal structure 400 may be formed in the metal structure 400. In addition, a parasitic pattern 420 connected to the through-via 430 may be disposed on an upper surface of the metal structure 400. In this case, at least a portion of the insulator 410 may be respectively disposed between the metal structure 400 and the parasitic pattern 420 and between the metal structure 400 and the through-via 430 to provide an insulating region. Meanwhile, the parasitic pattern 420 may be connected to at least a portion of the plurality of wiring layers 120 and 220 of the wiring structure 300 through the through-via 430. It is possible to design an antenna-related circuit in the metal structure 400 through the parasitic pattern 420, thereby miniaturizing the antenna 600.

Meanwhile, the antenna 600 may be a chip-type antenna including a dielectric 610 and antenna patterns 621, 622, and 623 formed on the dielectric 610. The chip-type antenna may be independently disposed in the through-portion 400H of the metal structure 400. Therefore, a yield of the antenna module 800A may be improved. The dielectric 610 may include dielectric layers 611 and 612 and a bonding layer 613 disposed between the dielectric layers 611 and 612 to bond the dielectric layers 611 and 612. In this case, the dielectric layers 611 and 612 may be materials having a high dielectric constant (Dk), for example, ceramic layers and/or ceramic-polymer composite layers, respectively. Therefore, the antenna 600 may have excellent antenna characteristics. The antenna pattern 620 may include a patch pattern 621. For example, the antenna pattern 620 may include a patch pattern 621, a coupling pattern 622 disposed above the patch pattern 621, and pad patterns 623 and 624 disposed below the patch pattern 621, and a feed via 630 connecting the patch pattern 621 and the pad pattern 623. Therefore, the antenna 600 can function as a patch antenna.

Meanwhile, the antenna 600 may be connected to at least a portion of the plurality of wiring layers 120 and 220 of the wiring structure 300 through the connection via 133. For example, the pad patterns 623 and 624 of the antenna 600 may be connected to at least a portion of the plurality of first wiring layers 120 of the first region of the wiring structure 300 through a connection via 133 penetrating at least a portion of the plurality of first insulating layers of the first region 100 of the wiring structure 400. In this case, since a signal from the antenna 600 can be transmitted through the connection via 133 instead of a solder ball, or the like, signal loss can be reduced.

Hereinafter, components of the antenna module 800A according to an example will be described in more detail with reference to the drawings.

The wiring structure 300 may include a first region 100 including a plurality of first insulating layers 110 and a plurality of first wiring layers 120, and a second region including a plurality of second insulating layers 210 and a plurality of second wiring layers 220. Based on the thickness direction, the first region 100 may be disposed between the metal structure 400 and the second region 200. The first region 100 may function as an antenna member, and the second region 200 may function as a redistribution member. For example, at least a portion of the plurality of first insulating layers 110 may include a material having a smaller dielectric dissipation factor (Df) than at least a portion of the plurality of second insulating layers 210.

The plurality of first insulating layers 110 may include a laminate in which the thermoplastic resin layer 111 and the thermosetting resin layer 112 are alternately stacked. The thermoplastic resin layer 111 may include a material that is effective for high frequency signal transmission, and the thermosetting resin layer 112 may include a material that is advantageous for high frequency signal transmission and has excellent bonding properties. Through such multilayer resin layers 111 and 112, it is possible to provide an insulating body that is advantageous for high frequency signal transmission and has excellent adhesion. The plurality of first wiring layers 120 may be disposed on the thermoplastic resin layer 111, respectively, and embedded in the thermosetting resin layer 112, and may be connected to each other through the plurality of first via layers 130. The plurality of first via layers 130 may include connection vias simultaneously penetrating the thermoplastic resin layer 111 and the thermosetting resin layer 112, which are adjacent to each other.

As the thermoplastic resin layer 111, in terms of high frequency signal transmission, liquid crystal polymer (LCP), polytetrafluoroethylene (PTFE), polyphenylene sulfide (PPS), polyphenylene ether (PPE), polyimide (PI), or the like may be used. A dielectric dissipation factor (Df) may be adjusted according to the type of resin of the thermoplastic resin layer 111, the type of filler contained in the resin, the content of the filler, and the like. The dielectric dissipation factor (Df) is a value for dielectric loss, and dielectric loss means loss power generated when an alternating electric field is formed in a resin layer (a dielectric). The dielectric dissipation factor (Df) is proportional to the dielectric loss, and the smaller the dielectric dissipation factor (Df), the lower the dielectric loss. The thermoplastic resin layer 111 having low dielectric loss characteristics is advantageous in terms of loss reduction in high frequency signal transmission. The dielectric dissipation factor (Df) of the thermoplastic resin layer 111 may be 0.003 or less, respectively, for example, 0.002 or less. In addition, the dielectric constant (Dk) of the thermoplastic resin layer 111 may be 3.5 or less.

As the thermosetting resin layer 112, in terms of high frequency signal transmission, polyphenylene ether (PPE), modified polyimide (PI), modified epoxy, or the like may be used. The dielectric dissipation factor (Df) may be adjusted according to the type of resin of the thermosetting resin layer 112, the type of filler contained in the resin, the content of the filler, and the like. The thermosetting resin layer 112 having low dielectric loss characteristics is advantageous in terms of loss reduction in high frequency signal transmission. The dielectric dissipation factor (Df) of the thermosetting resin layer 112 may be 0.003 or less, for example, 0.002 or less. In addition, the dielectric constant (Dk) of the thermosetting resin layer 112 may be 3.5 or less.

The thickness of the thermoplastic resin layer 111 may be thicker than the thickness of the thermosetting resin layer 112. In terms of high frequency signal transmission, it may be more desirable to have this thickness relationship. An interface between the thermoplastic resin layer 111 and the thermosetting resin layer 112, which are adjacent, upwardly and downwardly, may include a roughness surface. The roughness surface means a surface that has been roughened and having unevenness. According to the roughness surface, the thermoplastic resin layer 111 and the thermosetting resin layer 112, which are adjacent, upwardly and downwardly, can secure adhesion to each other.

The plurality of first wiring layers 120 may include a metal material. As the metal material, copper (Cu), aluminum (Al), silver (Ag), tin (Sn), gold (Au), nickel (Ni), lead (Pb), titanium (Ti), or alloys thereof may be used. The plurality of first wiring layers 120 may be formed of an additive process (AP), a semi AP (SAP), a modified SAP (MSAP) tenting (TT), and the like, and as a result, may include a seed layer, an electroless plating layer, and an electrolytic plating layer formed based on the seed layer. The plurality of first wiring layers 120 may perform various functions according to the design of the corresponding layer. For example, the plurality of first wiring layers 120 may include a feed pattern connected to the antenna 600. In addition, the plurality of first wiring layers 120 may include a ground pattern disposed around the feed pattern. If necessary, a power pattern may also be included. Each of these patterns may include a line pattern, a plane pattern, and/or a pad pattern.

A plurality of first via layers 130 may include a metal material. As the metal material, copper (Cu), aluminum (Al), silver (Ag), tin (Sn), gold (Au), nickel (Ni), lead (Pb), titanium (Ti), or alloys thereof may be used. The plurality of first via layers 130 may be formed by plating processes such as an AP, a SAP, a MASP, TT, and the like, and as a result, may include a seed layer, an electroless plating layer, and an electrolytic plating layer formed based on the seed layer. The plurality of first via layers 130 may perform various functions according to designs. For example, the plurality of first via layers 130 may include a feed via for connecting a feed pattern, a ground via for ground connection, a power via for power connection, and the like. Meanwhile, an uppermost via layer of the plurality of first via layers 130 may include the above-described connection via 133, and the connection via 133 may include a feed via and/or a ground via. These vias may be completely filled with a metal material, respectively, or the metal material may be formed along a wall surface of a via hole. In addition, the vias may have various shapes such as a tapered shape, or the like.

A plurality of second insulating layers 210 may include an insulating material. As the insulating material, a thermosetting resin such as an epoxy resin, a thermoplastic resin such as polyimide, or a resin in which including a reinforcing material such as a glass fiber, a glass cloth, and a glass fabric, and/or an inorganic filler, for example, prepreg, an Ajinomoto Build-up Film (ABF), a Photo Imagable Dielectric (PID), and the like may be used.

A plurality of second wiring layers 220 may include a metal material. As the metal material, copper (Cu), aluminum (Al), silver (Ag), tin (Sn), gold (Au), nickel (Ni), lead (Pb), titanium (Ti), or alloys thereof may be used. The plurality of second wiring layers 220 may be formed by plating processes such as an AP, a SAP, a MASP, TT, and the like, and as a result, may include a seed layer, an electroless plating layer, and an electrolytic plating layer formed based on the seed layer. The plurality of second wiring layers 220 may perform various functions according to designs. For example, the plurality of second wiring layers 220 may include a ground pattern, a power pattern, a signal pattern, and the like. Here, the signal pattern includes various signals except for the ground pattern and power pattern, for example, an antenna signal, a data signal, and the like. Each of these patterns may include a line pattern, a plane pattern and/or a pad pattern.

A plurality of second via layers 230 may include a metal material. As the metal material, copper (Cu), aluminum (Al), silver (Ag), tin (Sn), gold (Au), nickel (Ni), lead (Pb), titanium (Ti), or alloys thereof may be used. The plurality of second wiring layers 220 may be formed by plating processes such as an AP, a SAP, a MASP, TT, and the like, and as a result, may include a seed layer, an electroless plating layer, and an electrolytic plating layer formed based on the seed layer. The plurality of first via layers 230 may perform various functions according to designs. For example, the plurality of first via layers 230 may include a signal via for signal connection, a ground via for ground connection, and a power via for power connection, and the like. These vias may be completely filled with a metal material, respectively, or the metal material may be formed along a wall surface of a via hole. In addition, the vias may have various shapes such as a tapered shape, or the like.

A metal structure 400 may include a metal material. For example, the metal structure 400 may be a mass made of metal. As the metal material, copper (Cu), aluminum (Al), silver (Ag), tin (Sn), gold (Au), nickel (Ni), lead (Pb), titanium (Ti), or alloys thereof may be used. However, the present disclosure is not limited thereto, and may include other alloy materials such as Invar or the like, having a small thermal expansion coefficient. Considering costs and the like, more preferably, the metal structure 400 may include copper (Cu). For example, it may be a copper mass. The metal structure 400 may include one or more through-portions 400H. For example, the through portion 400H may be formed in an array of 1×2 as shown in FIG. 4, but is not limited thereto, and may be formed in an array of 1×4 or 2×2 depending on the disposed number of antennas 600. A thickness of the metal structure 400 may be greater than a thickness of each of the plurality of first wiring layers 120, a thickness of each of plurality of second wiring layers 220, and a thickness of each of conductive patterns, such as the pad patterns 623 and 624 and the antenna patterns 621, 622, and 623, of the antenna 600.

In one example, a thickness of an element may means a dimension of the element in a thickness direction of the element, and may be one of an average thickness, a maximum thickness, and a thickness measured in a center portion of the element. The thickness direction of the element may refer to a direction in which major surfaces of the element oppose each other. In another example, the thickness direction of the element may refer to a direction in which the element, as well as other elements, are laminated.

In one example, the thickness of the element may be determined by defining a predetermined number (e.g., 5) of points to the left and the predetermined number (e.g., 5) of points to the right from a reference center point of the element at equal intervals (or non-equal intervals, alternatively), measuring a thickness of each of the points at equal intervals (or non-equal intervals, alternatively), and obtaining an average value therefrom, based on an image of a cross-section cut, scanned by, for example, a scanning electron microscope (SEM). The reference center point may have the same distance, or substantially the same distance in consideration of a measurement error, from opposing edges of the element in the cross-section cut. In this case, the thickness may be an average thickness of the element.

Alternatively, the thickness may be determined by defining a predetermined number (e.g., 5) of points to the left and the predetermined number (e.g., 5) of points to the right from a reference center point of the element at equal intervals (or non-equal intervals, alternatively), measuring a thickness of each of the points at equal intervals (or non-equal intervals, alternatively), and obtaining a maximum value therefrom, based on an image of a cross-section cut, scanned by, for example, a scanning electron microscope (SEM) In this case, the thickness may be a maximum thickness of the element.

Alternatively, the thickness may be a thickness of a reference center point of the element, based on an image of a cross-section cut scanned by, for example, a scanning electron microscope (SEM). The reference center point may have the same distance, or substantially the same distance in consideration of a measurement error, from opposing edges of the element in the cross-section cut.

An insulator 410 may include an insulating material. As the insulating material, a material having excellent insulating properties may be used even when the thickness is thin, such as a polyimide composite material, perylene or the like. The insulator 410 may have a thin thickness of about 5 μm to 10 μm. The insulator 410 may cover at least a portion of each of the upper and lower surfaces of the metal structure 400. In addition, the insulator 410 may cover at least a portion of a wall surface of each of the through-portions 400H. Thereby, adhesion of the metal structure 400 may be improved, and an insulating region may be provided at a required position of the metal structure 400. In one example, a via extending through the insulator 400 may connect the metal structure 400 to an uppermost one of the plurality of first wiring layers 120.

A parasitic pattern 420 may include a metal material. As the metal material, copper (Cu), aluminum (Al), silver (Ag), tin (Sn), gold (Au), nickel (Ni), lead (Pb), titanium (Ti), or alloys thereof may be used. The parasitic pattern 420 may be formed by plating processes such as an AP, a SAP, a MSAP, and TT, and as a result, may include a seed layer, an electroless plating layer, and an electrolytic plating layer formed based on the seed layer, respectively. The parasitic pattern 420 may provide an antenna-related circuit. For example, the parasitic pattern 420 may be formed to surround a coupling pattern 622 of the antenna 600, and may be coupled to the coupling pattern 622 with each other. Through this coupling, a bandwidth of the antenna can be wider compared to a size. In addition, the antenna 600 can be miniaturized.

A through-via 430 may include a metal material. As the metal material, copper (Cu), aluminum (Al), silver (Ag), tin (Sn), gold (Au), nickel (Ni), lead (Pb), titanium (Ti), or alloys thereof may be used. The through-via 430 may be formed by plating processes such as a AP, a SAP, a MSAP, TT, and the like, and as a result, may include a seed layer, an electroless plating layer and an electrolytic plating layer formed based on the seed layer. The through-via 430 may connect the parasitic pattern 420 with at least a portion of the plurality of wiring layers 120 and 220. For example, the through-via 430 may be connected to a ground pattern among the plurality of wiring layers 120 and 220. The number of through-vias 430 is not particularly limited and may be disposed to surround the antenna 600. The through-via 430 may be completely filled with a metal material, or the metal material may be formed along a wall surface of a via hole. In addition, the through-via 430 may have various shapes such as a cylindrical shape, an hourglass shape or the like.

A passivation layer 450 covering at least a portion of each of the antennas 600 and filling at least a portion of each of the through-portions 400H may be disposed on the metal structure 400 if necessary. The passivation layer 450 may include a thermosetting resin. For example, the passivation layer 450 may be ABF. However, the present disclosure is not limited thereto, and the passivation layer 450 may be a known solder resist (SD) layer. In addition, PID may be included. If necessary, an insulating resin having a high dielectric constant (Dk) may be used as a material for the passivation layer 450, or an insulating resin having a low dielectric dissipation factor (Df) may also be used.

The antenna 600 may be a chip-type patch antenna including a dielectric 610 and antenna patterns 621, 622, and 623 formed on the dielectric 610. The chip-type patch antenna may be independently disposed in the through-portion 400H of the metal structure 400. Therefore, a yield of the antenna module 800A can be improved. The antenna 600 may be disposed in a 1×2 array as shown in FIG. 4, but is not limited thereto, and may be disposed in various forms, such as a 1×4 array or a 2×2 array, if necessary.

The dielectric 610 may include dielectric layers 611 and 612 and a bonding layer 613 disposed between the dielectric layers 611 and 612 to bond the dielectric layers 611 and 612. The dielectric layers 611 and 612 may include a material having a high dielectric constant (Dk), respectively. For example, the dielectric layers 611 and 612 may be ceramic layers and/or ceramic-polymer composite layers, respectively. However, the present disclosure is not limited thereto, and the dielectric layers 611 and 612 may be insulating layers including an insulating material having a high dielectric constant (Dk) such as PTFE, or the like. The ceramic-polymer composite layer may be a layer in which a ceramic filler is dispersed in an organic binder. Polymers such as PTFE, epoxy or the like may be used as the organic binder. As the ceramic filler, a filler composed of $SiO_2$, $TiO_2$, $Al_2O_3$ or the like may be used. For the shape of the ceramic filler, various shapes such as a square shape or a circular shape may be applied. A diameter of the ceramic filler may be 50 μm or less. In a ceramic-polymer composite layer, glass fiber may be included as a reinforcing material, if necessary.

The bonding layer 613 has a dielectric constant (Dk) smaller than that of the dielectric layers 611 and 612, and may include a material having better bonding strength. For example, the bonding layer 613 may include a polymer such as PTFE or epoxy having a lower dielectric constant (Dk) than the material of the dielectric layers 611 and 612. The thickness of the bonding layer 613 may be thinner than the thickness of each of the dielectric layers 611 and 612.

The antenna pattern 620 may include a metal material. As the metal material, copper (Cu), aluminum (Al), silver (Ag), tin (Sn), gold (Au), nickel (Ni), lead (Pb), titanium (Ti), or alloys thereof may be used. The parasitic pattern 420 may be formed by plating processes such as an AP, a SAP, a MSAP, TT, and the like, and as a result, may include a seed layer, an electroless plating layer, and an electrolytic plating layer formed based on the seed layer. The patch pattern 621 may receive an RF signal through a feed pattern and a feed via in the wiring structure 300 and transmit the RF signal in a thickness direction (z-direction), and transmit the RF signal received from the thickness direction to the electronic component 700, for example, the RFIC 710, through the feed pattern and the feed via in the wiring structure 300. The patch pattern 621 may have an intrinsic resonance frequency according to intrinsic factors such as a shape, a size height, and a dielectric constant of the insulating layer, for example, 28 GHz or 39 GHz. For example, the patch pattern 621 may be electrically connected to the electronic component 700, for example, the RFIC 710, through the feed pattern and the feed via in the wiring structure 300, such that the patch pattern 621 may transmit and receive a horizontal pole (H-pole) RF signal and a vertical pole (V-pole) RF signal, which are polarized with each other. The coupling pattern 622 may be disposed above the patch pattern 621, for example, in a thickness direction. The coupling pattern 622 may be disposed such that at least a portion thereof overlaps the patch pattern 621 with each other on a plane. In one example, a first portion overlapping a second portion on a plane may mean that, on the plane which is perpendicular to a direction in which the first portion is stacked on or below the second portion, or substantially perpendicular to the direction in which the first portion is stacked on or below the second portion in consideration of a measurement error or a process error, the first portion and the second portion overlay with each other. It may have an additional resonance frequency adjacent to the intrinsic resonance frequency described above by electromagnetic coupling between the coupling pattern 622 and the patch pattern 621, and thus may have a wider bandwidth. The pad patterns 623 and 624 may connect the antenna 600 to the wiring structure 400. For example, the pad pattern 623 may be connected to the patch pattern 621 through the feed via 630 penetrating the dielectric layer 611, and may be connected to the feed pattern of the plurality of first wiring layers 120 of the first region 110 of the wiring structure 400 through the connection via 133. In addition, the pad pattern 624 may be disposed to surround the pad pattern 623, and if necessary, the pad pattern 624 may be connected to the ground pattern of the plurality of first wiring layers 120 of the first region 110 of the wiring structure 400 through the connection via.

The feed via 630 may include a metal material. As the metal material, copper (Cu), aluminum (Al), silver (Ag), tin (Sn), gold (Au), nickel (Ni), lead (Pb), titanium (Ti), or alloys thereof may be used. The feed via 630 may be formed by plating processes such as an AP, a SAP, a MSAP, TT, and the like, and as a result, may include a seed layer, an electroless plating layer, and an electrolytic plating layer formed based on the seed layer. The feed via 630 may be completely filled with a metal material, or the metal material may be formed along a wall surface of a via hole. In addition, it may have various shapes such as a cylindrical shape or an hourglass shape.

The electronic component 700 may include various types of active components and/or passive components. For example, the electronic component 700 may include an RFIC 710, a power management integrated circuit (PMIC) 720, and the like. In addition, it may include a chip-type passive component, for example, a chip-type capacitor or a chip-type inductor. These electronic components 700 may be respectively connected to at least a portion of the plurality of second wiring layers 220 of the second region 200 of the wiring structure 400 through connection metals 715 and 725. The connection metals 715 and 725 may be formed of a low melting point metal having a lower melting point than copper (Cu), for example, tin (Sn) or an alloy containing tin (Sn). For example, it may be formed of solder, but this is merely an example and the material thereof is not limited thereto.

Figure 5:
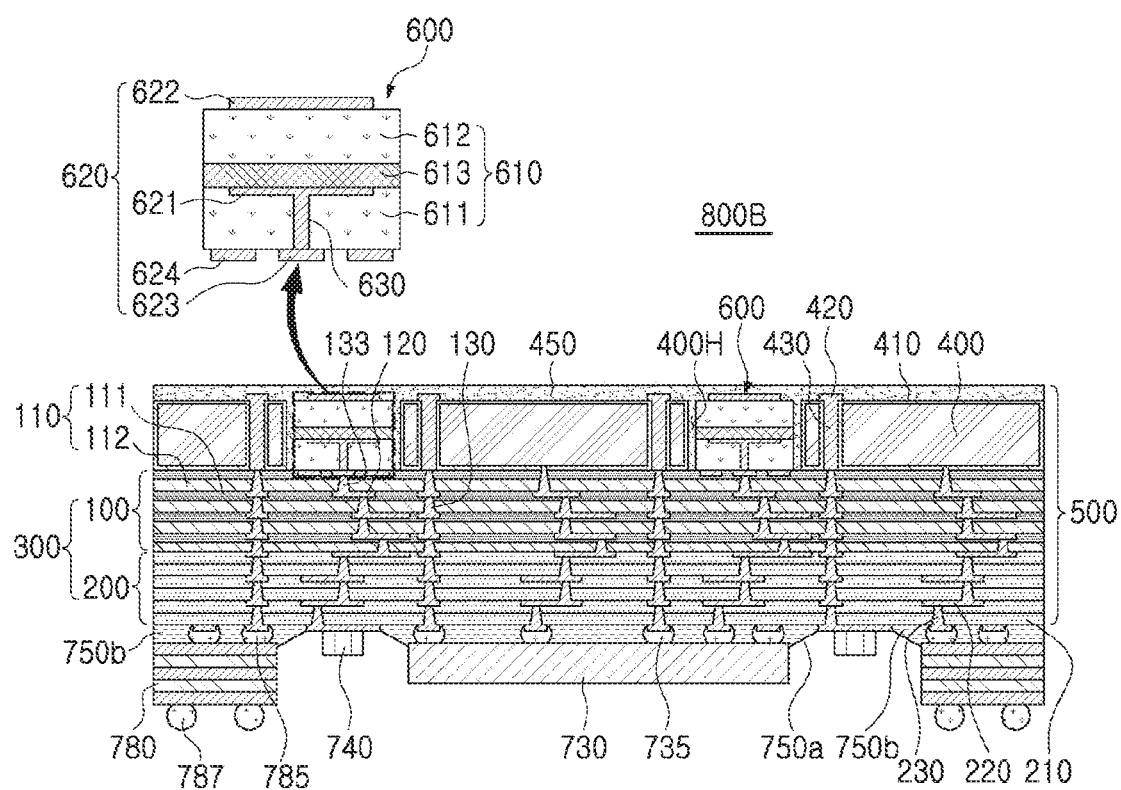
FIG. 5 is a schematic cross-sectional view illustrating another example of an antenna module.

FIG. 5 is a schematic cross-sectional view illustrating another example of an antenna module.

Referring to FIG. 5, in an antenna module 800B according to another example, in the antenna module 800A according to the above-described example, an integrated circuit (IC) 730 and a passive component 740 are surface-mounted on a lower surface of the wiring structure 300 as an electronic component. The IC 730 may include RFIC, PMIC, and the like. The passive component 740 may include a chip-type capacitor, a chip type inductor, and the like. The IC 730 may be surface mounted through connection metal 735. The passive component 740 may also be surface mounted through connection metal such as solder or the like. The IC 730 may be fixed through an underfill resin 750a disposed on the lower surface of the wiring structure 300. The underfill resin 750a may include a known insulating resin having adhesive properties, such as an epoxy resin. If necessary, an interposer 780 may be disposed on the lower surface of the wiring structure 300. The interposer 780 may be disposed in parallel with electronic components such as the IC 730, the passive components 740, and the like. The interposer 780 may be connected to at least a portion of the plurality of second wiring layers 220 of the second region 200 of the wiring structure 400 through upper connection metal 785. In addition, it can be connected to other types of printed circuit boards, such as the main board through lower connection metal 787. For example, the antenna module 800B may be mounted on a main board or the like through the interposer 780. The interposer 780 may be fixed through an underfill resin 750b. The interposer 780 may be an organic interposer having an insulating resin as an insulating body. However, the present disclosure is not limited thereto, and may be a silicon interposer using silicon as an insulating body. The interposer 780 may be a single substrate in a ring form having a through-portion in which electronic components are disposed, or may include a plurality of units disposed space apart from each other. Other contents are substantially the same as those described above, and detailed description thereof is omitted.

Figure 6:
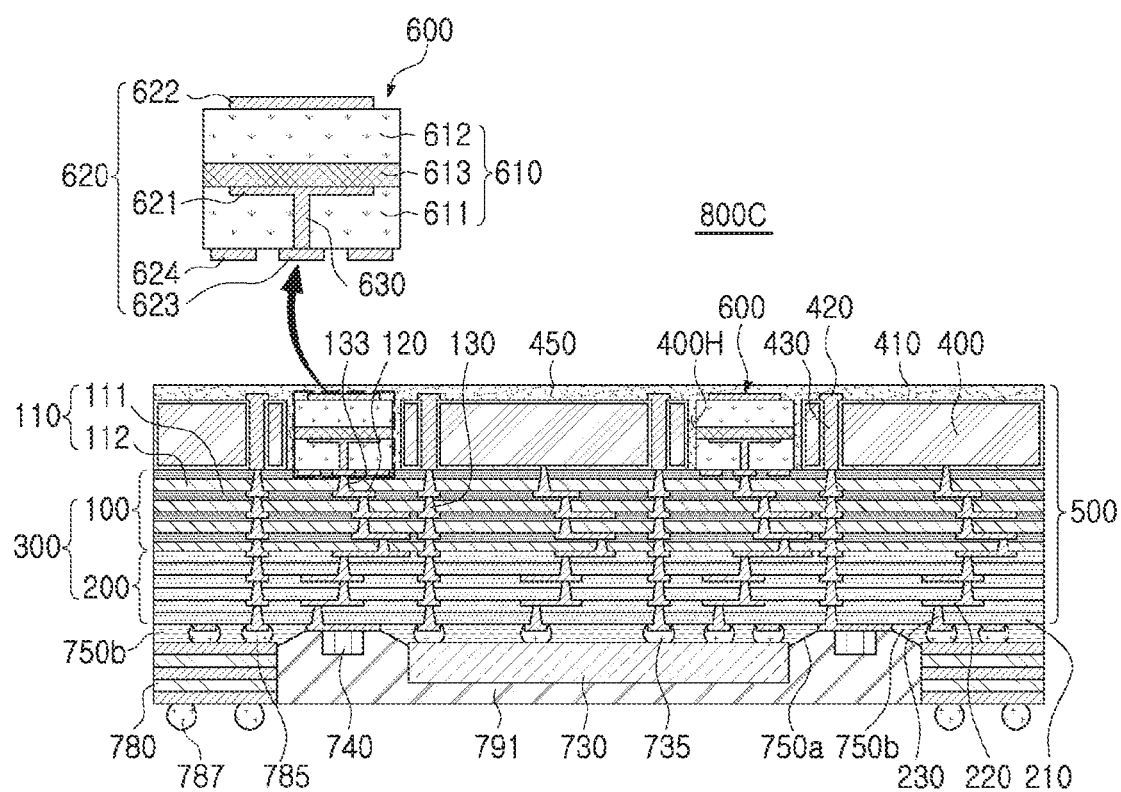
FIG. 6 is a schematic cross-sectional view illustrating another example of an antenna module.

FIG. 6 is a schematic cross-sectional view illustrating another example of an antenna module.

Referring to FIG. 6, in an antenna module 800C according to another example, in the antenna module 800B according to another example described above, a molding material 791 disposed on a lower surface of the wiring structure 300, and covering an electronic component, for example, an IC 730 and a passive component 740, is further included. The electronic component can be protected through the molding material 791. The molding material 791 may be a known epoxy molding compound (EMC). However, the present disclosure is not limited thereto, and ABF, or the like may be used as the molding material 791. Other contents are substantially the same as those described above, and detailed description thereof is omitted.

Figure 7:
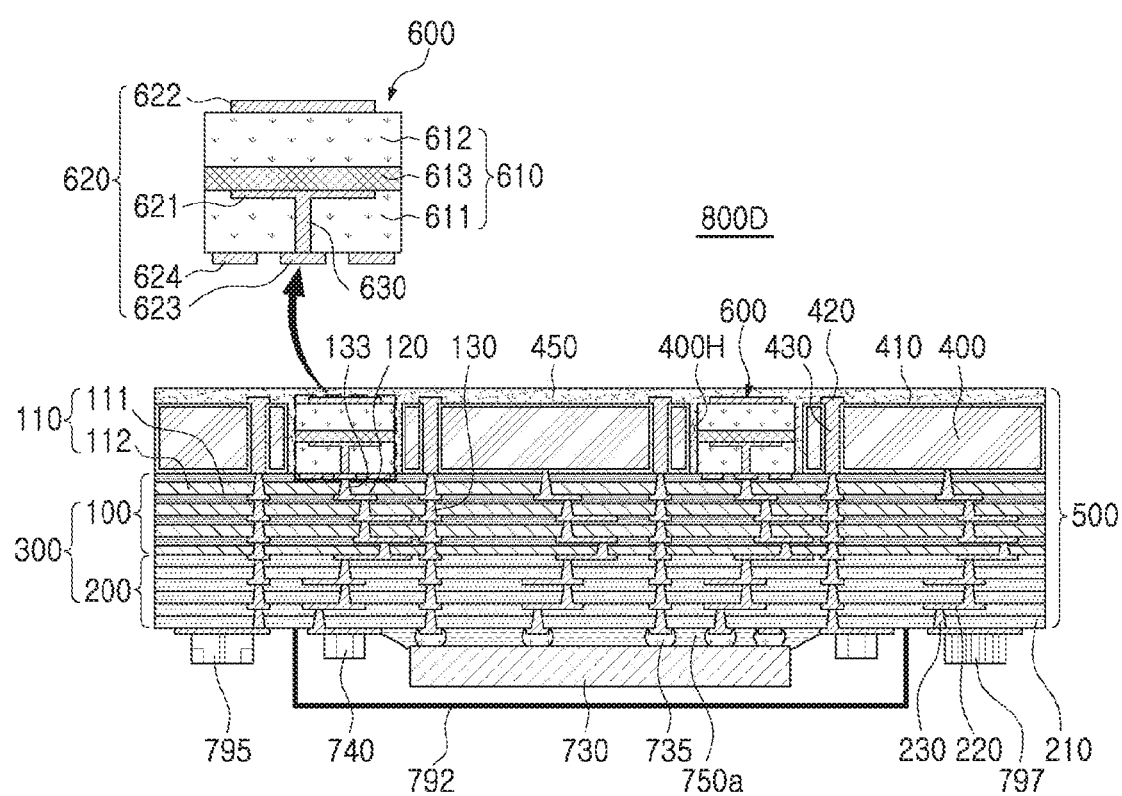
FIG. 7 is a schematic cross-sectional view illustrating another example of an antenna module.

FIG. 7 is a schematic cross-sectional view illustrating another example of an antenna module.

Referring to FIG. 7, in an antenna module 800D according to another example, in the antenna module 800B according to another example described above, a shield can 792 disposed on a lower surface of the wiring structure 300, and surrounding an electronic component, for example, the IC 730 and the passive component 740 is further included. Electro Magnetic Interference (EMI) shielding is possible through the shield can 792. The shield can 792 may include a metal material. As the metal material, copper (Cu), aluminum (Al), silver (Ag), tin (Sn), gold (Au), nickel (Ni), lead (Pb), titanium (Ti), or alloys thereof may be used. However, the material of the shield can 792 is not limited to metal, and the shield can 792 may be, for example, a synthetic resin material containing metal powder. If necessary, connectors 795 and 797 may be further disposed on a lower surface of the wiring structure 300. The left connector 795 may be an RF receptacle, and may be connected to at least a portion of the plurality of second wiring layers 220 of the second region 200 of the wiring structure 400. The right connector 797 may be a connector for connection of a signal and/or power, and may be connected to at least a portion of the plurality of second wiring layers 220 of the second region 200 of the wiring structure 400. The antenna module 800D may be connected to another type of printed circuit board, such as a main board, through the connectors 795 and 797. Other contents are substantially the same as those described above, and detailed description thereof is omitted.

Figure 8:
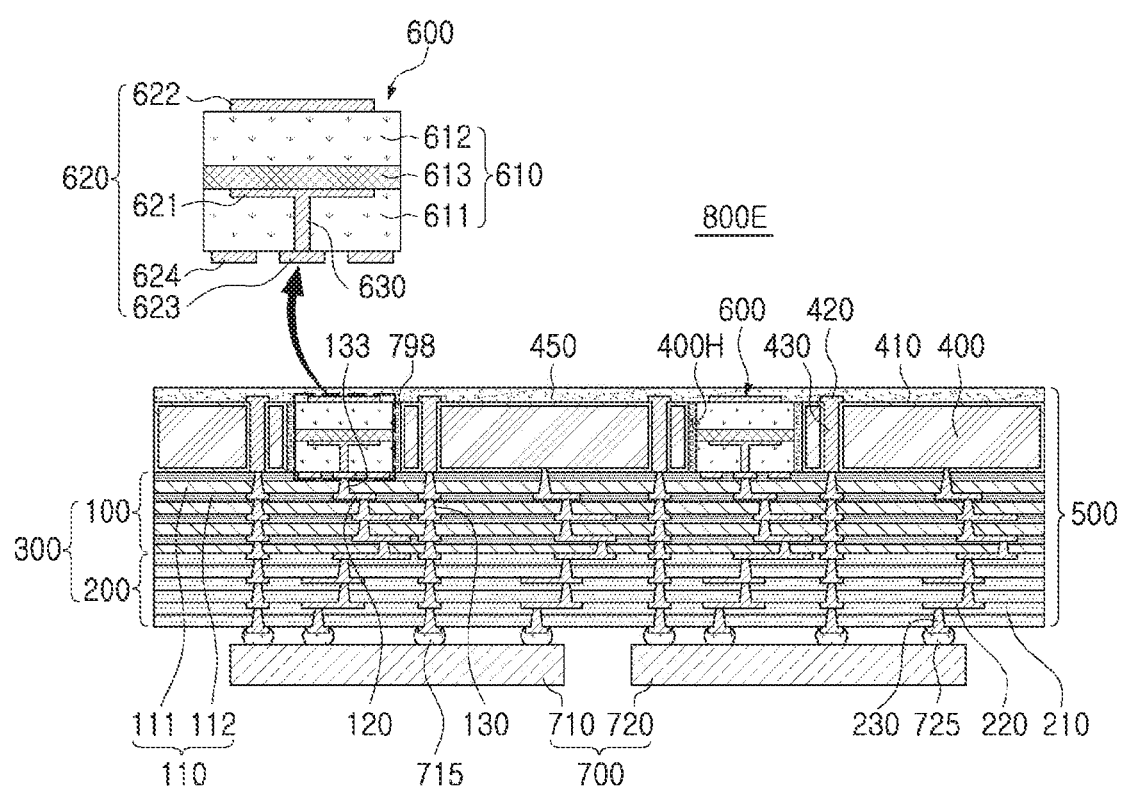
FIG. 8 is a schematic cross-sectional view illustrating another example of an antenna module.

FIG. 8 is a schematic cross-sectional view illustrating another example of an antenna module.

Referring to FIG. 8, in an antenna module 800E according to another example, in the antenna module 800A according to the above-described example, a heat dissipation member 798 are further disposed in the through-portion 400H of the metal structure 400. The heat dissipation member 798 may be disposed in parallel with the antenna 600. The heat dissipation member 798 may contact the antenna 600, but is not limited thereto, and both may be physically separated. Through the heat dissipation member 798, a better heat dissipation effect can be expected. The heat dissipation member 798 may be connected to at least a portion of the plurality of first wiring layers 120 of the first region 100 of the wiring structure 300, for example, to a ground pattern through a connection via. The heat dissipation member 798 may include a thermal interface material (TIM), and may include, for example, a graphite-based TIM for the better heat dissipation effect, but is not limited thereto. Meanwhile, if necessary, the heat dissipation member 798 may be further embedded and disposed at a suitable position in the wiring structure 300. Other contents are substantially the same as those described above, and detailed description thereof is omitted.

As set forth above, as one of several effects of the present disclosure, an antenna module having an excellent heat dissipation effect may be provided.

As another effect among the various effects of the present disclosure, an antenna module capable of effectively reducing signal interference may be provided.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items. It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

A value used to describe a parameter such as a 1-D dimension of an element including, but not limited to, "length," "width," "thickness," "diameter," "distance," "gap," and/or "size," a 2-D dimension of an element including, but not limited to, "area" and/or "size," a 3-D dimension of an element including, but not limited to, "volume" and/or "size", and a property of an element including, not limited to, "roughness," "density," "weight," "weight ratio," and/or "molar ratio" may be obtained by the method(s) and/or the tool(s) described in the present disclosure. The present disclosure, however, is not limited thereto. Other methods and/or tools appreciated by one of ordinary skill in the art, even if not described in the present disclosure, may also be used.

While exemplary embodiments have been shown and described above, it will be apparent to those skilled in the art that modifications and variations could be made without departing from the scope of the present invention as defined by the appended claims.

What is claimed is:

1. An antenna module, comprising:
a wiring structure including a plurality of insulating layers and a plurality of wiring layers;
a metal structure disposed on one surface of the wiring structure in a stacking direction, and having a through-portion extending therethrough in the stacking direction; and
an antenna disposed on the one surface of the wiring structure,
wherein at least a portion of the antenna is disposed in the through-portion so as to overlap the metal structure in a direction perpendicular to the stacking direction,
wherein the antenna comprises a dielectric and an antenna pattern disposed on the dielectric in the stacking direction, and
wherein the metal structure is spaced apart from the dielectric in the direction perpendicular to the stacking direction.

2. The antenna module of claim 1, further comprising an insulating cover covering at least a portion of the one surface of the wiring structure and a surface of the metal structure and at least a portion of a wall surface of the through-portion.

3. The antenna module of claim 2, further comprising:
a parasitic pattern disposed on the one surface of the wiring structure; and
a through via penetrating the metal structure, and connecting the parasitic pattern to at least a portion of the plurality of wiring layers,
wherein at least a portion of the insulating cover is disposed between the metal structure and the through via, and between the metal structure and the parasitic pattern, respectively.

4. The antenna module of claim 2, further comprising a via extending through the insulating cover to connect the metal structure to one of the plurality of wiring layers.

5. The antenna module of claim 1, wherein the dielectric comprises a first dielectric layer, a second dielectric layer disposed on the first dielectric layer, and a bonding layer disposed between the first and second dielectric layers,
the antenna pattern comprises a patch pattern disposed on one surface of the first dielectric layer, and embedded in the bonding layer, a pad pattern disposed on another surface of the first dielectric layer, and connected to the patch pattern through a feed via penetrating the first dielectric layer, and a coupling pattern disposed on one surface of the second dielectric layer, and
at least a portion of the patch pattern overlaps the coupling pattern on a plane.

6. The antenna module of claim 5, wherein the first and second dielectric layers independently comprise at least one of a ceramic layer and a ceramic-polymer composite layer, respectively.

7. The antenna module of claim 1, wherein the antenna is connected to at least a portion of the plurality of wiring layers by a connection via.

8. The antenna module of claim 1, further comprising an electronic component disposed on another surface of the wiring structure, and connected to at least a portion of the plurality of wiring layers,
wherein the electronic component comprises at least one of a power management integrated circuit (PMIC), a radio frequency integrated circuit (RFRC), or a passive component.

9. The antenna module of claim 8, further comprising an interposer disposed on the another surface of the wiring structure, in parallel with the electronic component, and connected to at least another portion of the plurality of wiring layers.

10. The antenna module of claim 9, further comprising a molding material disposed on the another surface of the wiring structure, and covering the electronic component.

11. The antenna module of claim 8, further comprising a shield can disposed on the another surface of the wiring structure, and surrounding the electronic component.

12. The antenna module of claim 11, further comprising a connector disposed on the another surface of the wiring structure, in parallel with the electronic component, and connected to at least another portion of the plurality of wiring layers.

13. The antenna module of claim 1, further comprising a heat dissipation member disposed on the one surface of the wiring structure, wherein at least a portion of the heat dissipation member is disposed in the through-portion,
wherein the heat dissipation member comprises a thermal interface material (TIM).

14. The antenna module of claim 1, wherein the wiring structure comprises a first region including a plurality of first insulating layers and a plurality of first wiring layers, and a second region including a plurality of second insulating layers and a plurality of second wiring layers,
the first region is disposed between the metal structure and the second region, and
at least a portion of the plurality of first insulating layers comprises a material having a lower dielectric dissipation factor (Df) than at least a portion of the plurality of second insulating layers.

15. The antenna module of claim 14, wherein the plurality of first insulating layers comprise a laminate in which a thermoplastic resin layer and a thermosetting resin layer are alternately stacked, and
the plurality of first wiring layers comprise a feed pattern and a ground pattern.

16. The antenna module of claim 1, wherein the metal structure comprises copper (Cu).

17. The antenna module of claim 1, wherein the antenna comprises conductive patterns,
the metal structure has a thickness greater than a thickness of each of the plurality of wiring layers and a thickness of each of the conductive patterns.

18. The antenna module of claim 1, further comprising a passivation layer covering at least a portion of the antenna and disposed in at least a portion of the through-portion interposed between the metal structure and the dielectric in the direction perpendicular to the stacking direction.

19. The antenna module of claim 1, wherein the at least a portion of the antenna is spaced apart from the metal structure in the direction perpendicular to the stacking direction.

* * * * *